:PATENT

(12) United States Patent
Foong et al.

(10) Patent No.: US 10,830,812 B2
(45) Date of Patent: Nov. 10, 2020

(54) LOW INDUCTANCE ELECTRICAL CONTACT ASSEMBLY MANUFACTURING PROCESS

(71) Applicant: JF MICROTECHNOLOGY SDN. BHD., Petaling Jaya, Selangor (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 261 days.

(21) Appl. No.: 16/115,322

(22) Filed: Aug. 28, 2018

(65) Prior Publication Data

US 2019/0064260 A1    Feb. 28, 2019

(30) Foreign Application Priority Data

Aug. 28, 2017  (MY) .......................... PI 2017703170

(51) Int. Cl.
*G01R 31/28*   (2006.01)
*H01R 13/405*  (2006.01)
(Continued)

(52) U.S. Cl.
CPC ..... *G01R 31/2886* (2013.01); *H01R 13/6461* (2013.01); *H01R 43/20* (2013.01);
(Continued)

(58) Field of Classification Search
CPC ............ H01R 13/2435; H01R 13/2442; H01R 13/2457; H01R 13/405; H01R 13/504; H01R 13/506; H01R 13/514; H01R 13/516; H01R 13/6461; H01R 43/20; H01R 43/24; H01R 2201/20; G01R 1/06772; G01R 1/07307; G01R 31/2886; Y10T 29/49208;
(Continued)

(56) References Cited

U.S. PATENT DOCUMENTS 7,179,127 B2* 2/2007 Shiu ..................... H01R 13/506
                                                              439/108
7,488,200 B2* 2/2009 Yamamoto ............. H01R 12/52
                                                              439/511

(Continued)

*Primary Examiner* — Peter Dungba Vo
*Assistant Examiner* — Joshua D Anderson
(74) *Attorney, Agent, or Firm* — Maschoff Brennan

(57) ABSTRACT

A manufacturing process for an electrical contact assembly that uses an assembly jig with a middle horizontal lip adapted to fit into a plurality of C-shaped inner contact pins, as well as top and bottom guide teeth that guide top and bottom parts of the inner pins as they are being assembled. An inner holder then covers the inner pins, at which point epoxy is applied, which when cured, secures the inner holder to the plurality of inner pins. Outer contact pins in turn cover the outside of the inner holder, and an outer holder covers the outer contact pins. Epoxy is also applied between the outer holder and outer pins, which when cured, secures the outer holder to the plurality of outer pins. A heat curing process is also employed to assist with the curing of the epoxy, during which a clamp temporarily holds the assembly in place.

6 Claims, 6 Drawing Sheets step f

(51) Int. Cl.
*H01R 13/6461* (2011.01)
*H01R 43/20* (2006.01)
*H01R 43/24* (2006.01)
*G01R 1/067* (2006.01)
*G01R 1/073* (2006.01)
*H01R 13/24* (2006.01)
*H01R 13/504* (2006.01)
*H01R 13/506* (2006.01)

(52) U.S. Cl.
CPC ......... *H01R 43/24* (2013.01); *G01R 1/06772* (2013.01); *G01R 1/07307* (2013.01); *H01R 13/2442* (2013.01); *H01R 13/405* (2013.01); *H01R 13/504* (2013.01); *H01R 13/506* (2013.01); *H01R 2201/20* (2013.01); *Y10T 29/49208* (2015.01)

(58) Field of Classification Search
CPC ........... Y10T 29/4921; Y10T 29/49211; Y10T 29/49222
See application file for complete search history.

(56) References Cited

U.S. PATENT DOCUMENTS

| 7,963,796 | B2* | 6/2011 | Sypolt | H01R 12/58 |
| | | | | 439/511 |
| 8,257,095 | B2* | 9/2012 | Akai | H01R 13/6315 |
| | | | | 439/74 |
| 9,780,504 | B2* | 10/2017 | Wang | H01R 24/60 |

* cited by examiner

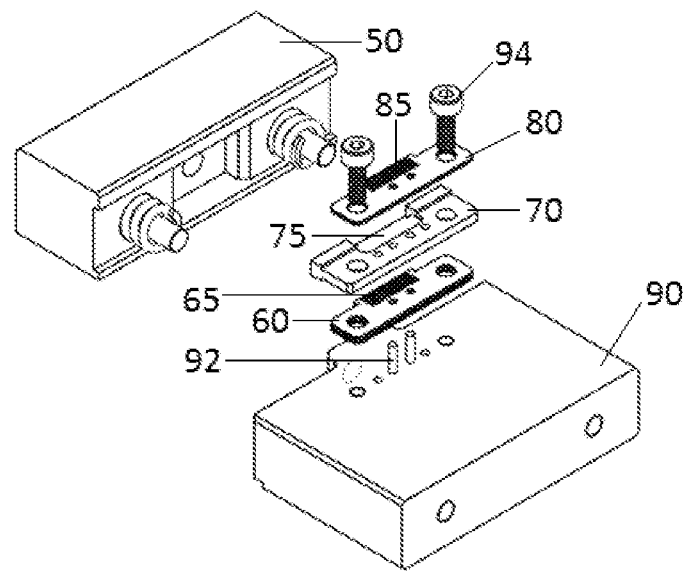
Figure 4 - step a
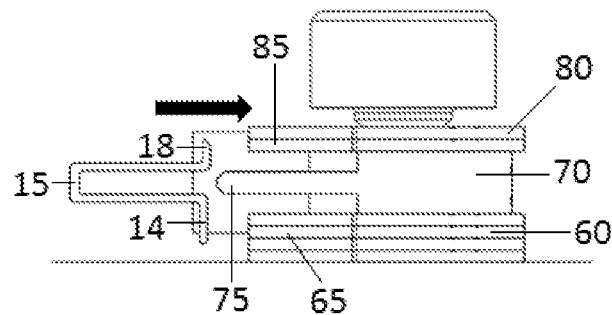
Figure 5 - step b

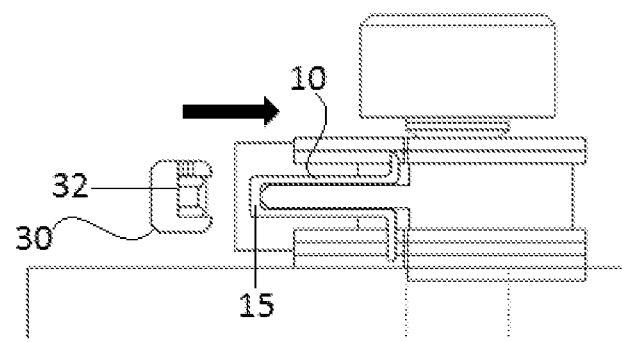
Figure 6 - step c
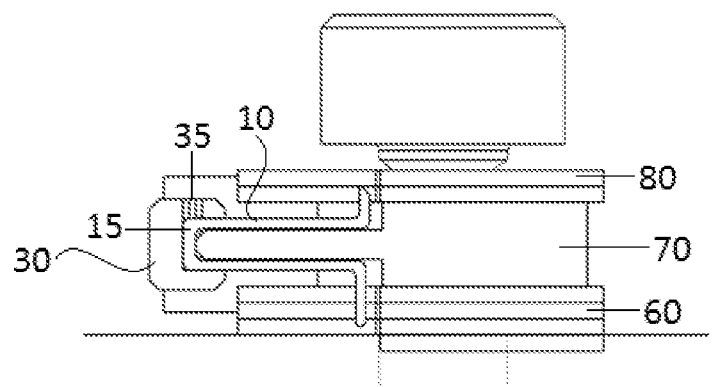
Figure 7
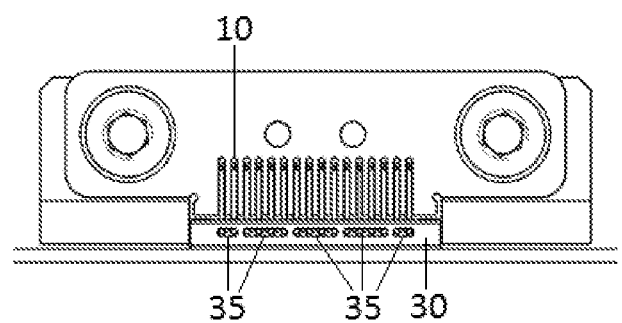
Figure 8

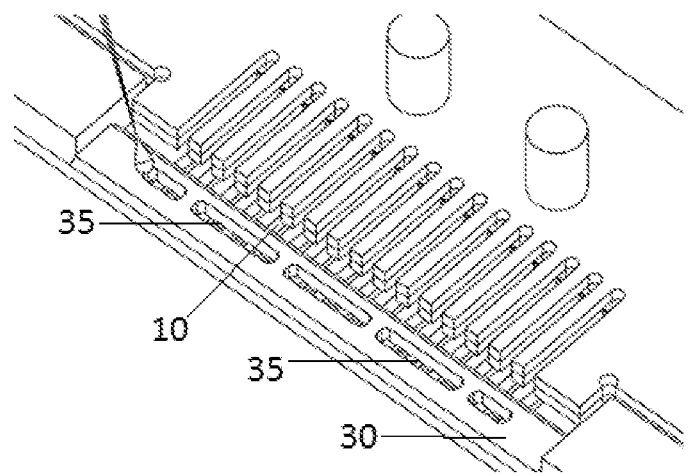
Figure 9 - step d
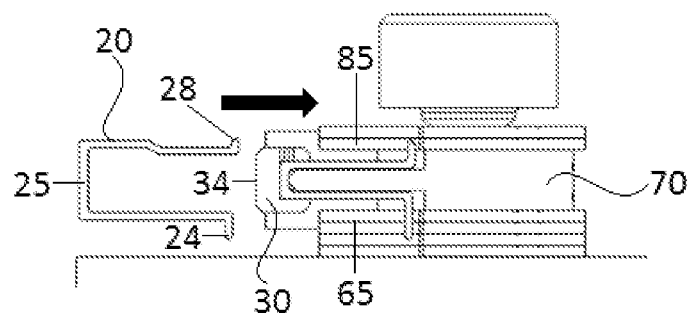
Figure 10 - step e

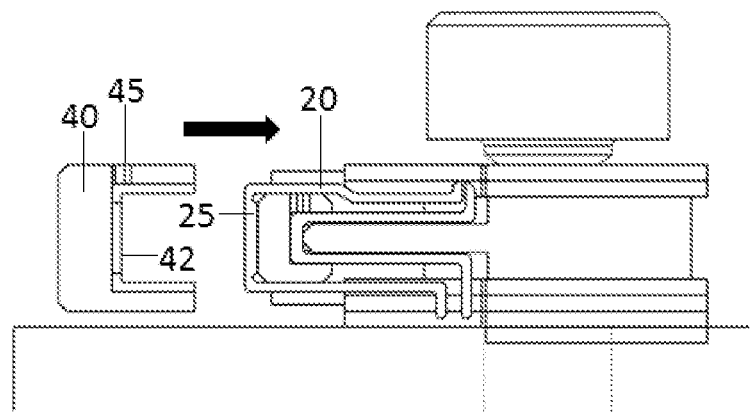
Figure 11 - step f
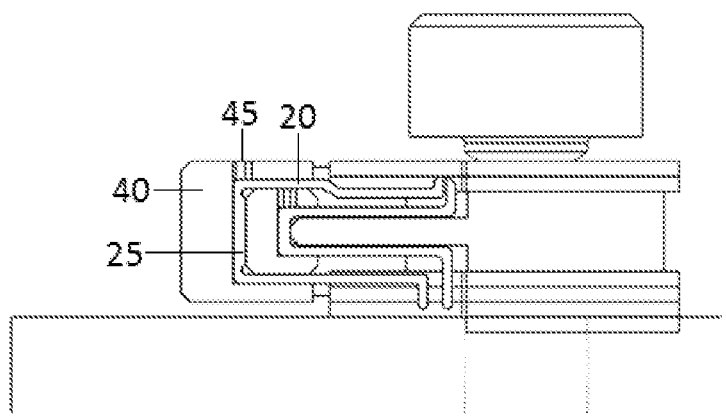
Figure 12
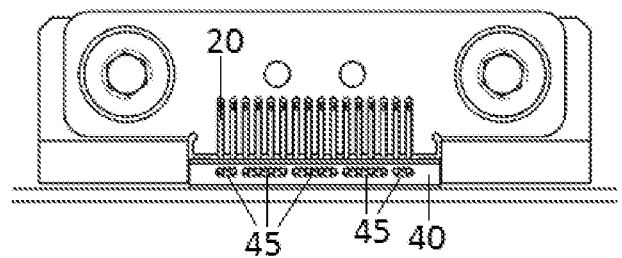
Figure 13

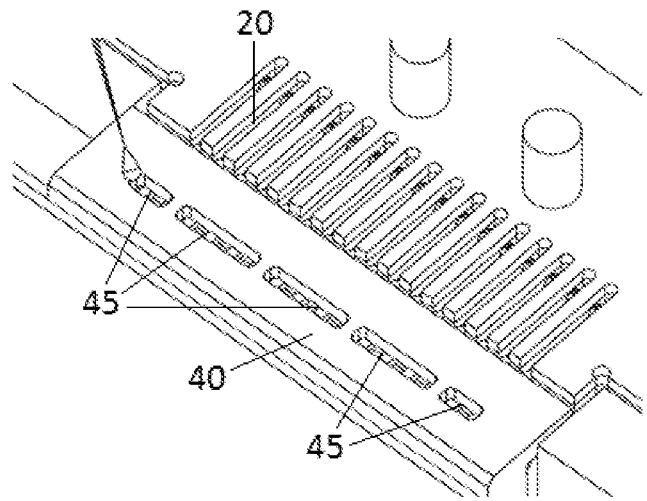
Figure 14 - step g
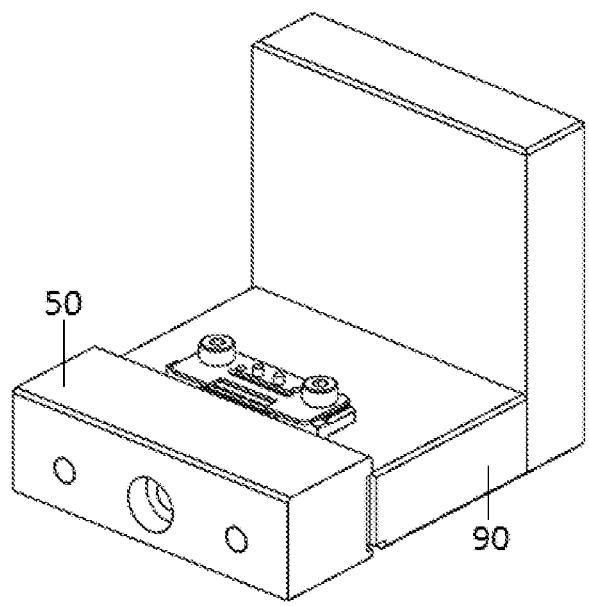
Figure 15 - steps h & i

LOW INDUCTANCE ELECTRICAL CONTACT ASSEMBLY MANUFACTURING PROCESS

FIELD OF INVENTION

The present invention relates to a manufacturing process for an electrical contact assembly in an integrated circuit testing apparatus, and specifically to one that produces a contact that has a low inductance in a small sized contact that is able to withstand high currents and high frequency testing.

BACKGROUND OF INVENTION

Currently available standard Kelvin contact assemblies used in integrated circuit (IC) testing apparatuses are typically in the size range of 3 mm and larger. This is to allow for easier handling of the contacts during installation, assembly, maintenance and rebuilding. At such sizes, the inductance of the contacts are typically 3 nH or higher. A higher inductance characteristic does not allow for testing with higher frequencies, due to the electro-magnetic interference that will result. Certain applications, namely: the Internet of things (smart homes, cars, etc) require IC chips that operate at high frequencies, and therefore testing at those frequencies.

What is needed in the art is a smaller electrical contact with a low inductance that is still easy to handle, assemble and maintain, and that allows testing at high frequencies (20 GHz or more), and thus a manufacturing process that produces such a contact.

Conversely, there are designs such as spring probes that allow for very small sizes of contacts, down below 3 mm. However, these type of contacts are complex designs with at least 3 separate parts, and are therefore more prone to faults and are also harder to assemble, especially at small sizes. Another downside to spring probe designs is their inability to handle high currents. Certain applications in the automotive industry require ICs that operate with high currents. Furthermore, the complex design on these spring probe type contacts make them less than ideal for tri-temperature testing. The screws, dowel pins and other non-homogeneous parts in the contacts cause changes in the contact's electrical properties when exposed to extreme temperatures, which in turn results in malfunctioning of the contact.

What is then also needed in the art is a low inductance electrical contact that has a simpler and more robust design and that allows testing at high currents, and thus a manufacturing process that produces such a contact.

Yet another type of contact design employs rigid pins along with a compressible elastomer, wherein the pins typically rock around a point when the device-under-test (DUT) is engaged to the testing apparatus, and the elastomer provides a resistant force that rocks the pin back to its initial position. These type of contacts, while able to achieve low inductance, unfortunately are not able to handle high temperatures. At high temperatures, the elastomer is prone to break-down. Therefore, these contacts are not suitable for tri-temperature testing.

What is then also needed in the art is a low inductance electrical contact that is able to handle testing at high temperatures.

SUMMARY OF INVENTION

The present invention seeks to overcome the aforementioned disadvantages by providing a manufacturing process for an electrical contact assembly that has a small size, a very low inductance, is able to handle high frequency and high current testing, and one that is easy to assemble, handle and maintain.

The present invention thus relates to a manufacturing process for an electrical contact assembly that uses an assembly jig with a middle horizontal lip adapted to fit into a plurality of C-shaped inner contact pins, as well as top and bottom guide teeth that guide top and bottom parts of the inner pins as they are being assembled. An inner holder then covers the inner pins, at which point epoxy is applied, which when cured, secures the inner holder to the plurality of inner pins.

Outer contact pins in turn cover the outside of the inner holder, and an outer holder covers the outer contact pins. Epoxy is also applied between the outer holder and outer pins, which when cured, secures the outer holder to the plurality of outer pins. A heat curing process is also employed to assist with the curing of the epoxy, during which a clamp temporarily holds the assembly in place.

This invention also relates to a process for manufacturing an electrical contact assembly for use in a testing apparatus, comprising the steps of:

a. preparing an assembly jig comprising a bottom guide template, a middle piece, and a top guide template, said middle piece having a horizontal lip, and said bottom guide template and top guide template each having respectively a bottom guide teeth section and a top guide teeth section, said bottom guide teeth section and top guide teeth section each comprising a row of elongated teeth;

b. inserting a plurality of inner pins into said assembly jig, each said inner pin having a C-shaped design formed by a bottom cantilever, a vertical section and a top cantilever, one by one, by driving said inner pin towards said horizontal lip until each said vertical section comes up against a leading edge of said horizontal lip, and at the same time said bottom cantilever being guided between two of the elongated teeth in the bottom guide teeth section, and the top cantilever being guided between two of the elongated teeth in the top guide teeth section, thereby causing each inner pin to fit snugly over said horizontal lip, and thereby said plurality of inner pins forming a row;

c. driving an inner holder towards said plurality of inner pins, such that said inner holder constrains a vertical section side of said inner pins, said inner holder provided with a plurality of elongated holes along its top side, said elongated holes adjacently above said plurality of inner pins;

d. applying adhesive into said plurality of elongated holes so that said adhesive is dispensed across a portion of said plurality of inner pins;

e. inserting a plurality of outer pins onto said inner holder, each said outer pin having a C-shaped design formed by a bottom cantilever, a vertical section and a top cantilever, one by one, by driving said outer pin towards an outer surface of said inner holder until each said vertical section comes up against said outer surface, and at the same time said bottom cantilever being guided between two of the elongated teeth in the bottom guide teeth section, and said top cantilever being guided between two of the elongated teeth in the top guide teeth section, thereby causing each outer pin to fit snugly over said inner holder, and thereby said plurality of outer pins forming a row;

f. driving an outer holder towards said plurality of outer pins, such that said outer holder constrains a vertical section side of said outer pins, said outer holder provided with a plurality of elongated holes along its top side, said elongated holes adjacently above said plurality of outer pins, and thus forming an electrical contact assembly comprising the inner pins, inner holder, outer pins and outer holder;

g. applying adhesive into said plurality of elongated holes so that said adhesive is dispensed across said plurality of outer pins;

h. securing the position of the inner pins, inner holder, outer pins and outer holder relative to one another while applying heat to portions of said assembly for curing said adhesive;

i. allowing said electrical contact assembly to cool down so that said adhesive is substantially hardened and thus inner pins, inner holder, outer pins and outer holder are secured together; and j. removing said electrical contact assembly from said assembly jig.

In a preferred embodiment, step a. "preparing an assembly jig" comprises fastening a bottom guide template, a middle piece, and a top guide template, in that sequence, onto a top of a base.

In another preferred embodiment, step h. "securing the position of the inner pins, inner holder, outer pins and outer holder relative to one another" comprises using a clamp that is driven towards said assembly jig so that it holds said electrical contact assembly in position in between said clamp and said assembly jig.

In other preferred embodiments the adhesive is an epoxy and the inner holder and outer holder are made from engineering plastic.

Other objects and advantages will be more fully apparent from the following disclosure and appended claims.

BRIEF DESCRIPTION OF DRAWINGS

FIG. 4 shows an exploded perpendicular view of an assembly jig, base and clamp of step a. in an embodiment of this invention.

FIG. 5 shows a cross-sectional side view of step b. in an embodiment of this invention.

FIG. 6 shows a cross-sectional side view of step c. in an embodiment of this invention.

FIG. 7 shows a cross-sectional side view of an electrical contact assembly after step c. in an embodiment of this invention.

FIG. 8 shows a top view of an electrical contact assembly after step c. in an embodiment of this invention.

FIG. 9 shows a perpendicular view of step d. in an embodiment of this invention.

FIG. 10 shows a cross-sectional side view of step e. in an embodiment of this invention.

FIG. 11 shows a cross-sectional side view of step f. in an embodiment of this invention.

FIG. 12 shows a cross-sectional side view of an electrical contact assembly after step f. in an embodiment of this invention.

FIG. 13 shows a top view of an electrical contact assembly after step f. in an embodiment of this invention.

FIG. 14 shows a perpendicular view of step g. in an embodiment of this invention.

FIG. 15 shows a perpendicular view of steps h. and i. in an embodiment of this invention.

DETAILED DESCRIPTION OF INVENTION

It should be noted that the following detailed description is directed to a manufacturing process for an electrical contact assembly of an integrated circuit (IC) testing apparatus, and is not limited to any particular size or configuration but in fact a multitude of sizes and configurations within the general scope of the following description.

LIST OF NUMBERED ELEMENTS IN FIGURES

Inner Pin (10)
Inner Pin Bottom Cantilever (13)
Inner Pin Load End (14)
Inner Pin Vertical Section (15)
Inner Pin Top Cantilever (17)
Inner Pin Device End (18)
Outer Pins (20)
Outer Pins Bottom Cantilever (23)
Outer Pin Load End (24)
Outer Pins Vertical Section (25)
Outer Pins Top Cantilever (27)
Outer Pin Device End (28)
Inner Holder (30)
Inner Holder Inner Surface (32)
Inner Holder Outer Surface (34)
Inner Holder Elongated Holes (35)
Outer Holder (40)
Outer Holder Inner Surface (42)
Outer Holder Outer Surface (44)
Outer Holder Elongated Holes (45)
Clamp (50)
Bottom Guide Template (60)
Bottom Guide Teeth Section (65)
Middle Piece (70)
Middle Piece Horizontal Lip (75)
Top Guide Template (80)
Top Guide Teeth Section (85)
Base (90)
Dowel Pins (92)
Bolts (94)

Figure 1:
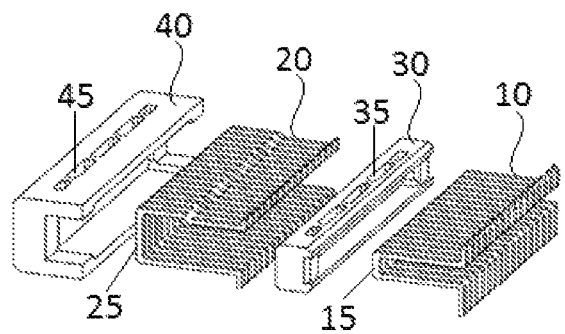
FIG. 1 shows an exploded perpendicular view of an electrical contact assembly in an embodiment of this invention.
Figure 2:
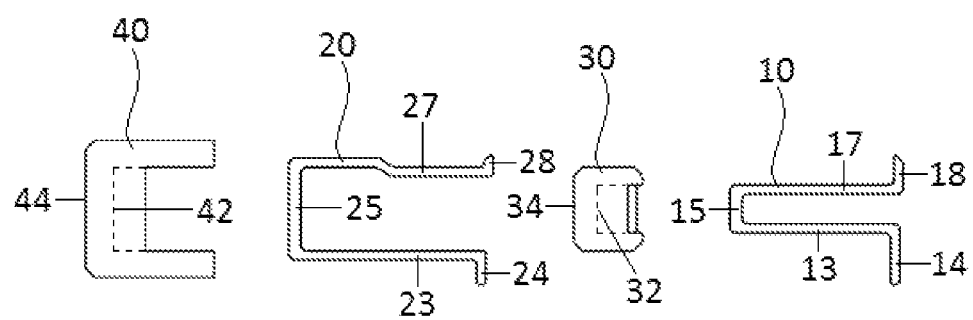
FIG. 2 shows an exploded side view of an electrical contact assembly in an embodiment of this invention.
Figure 3:
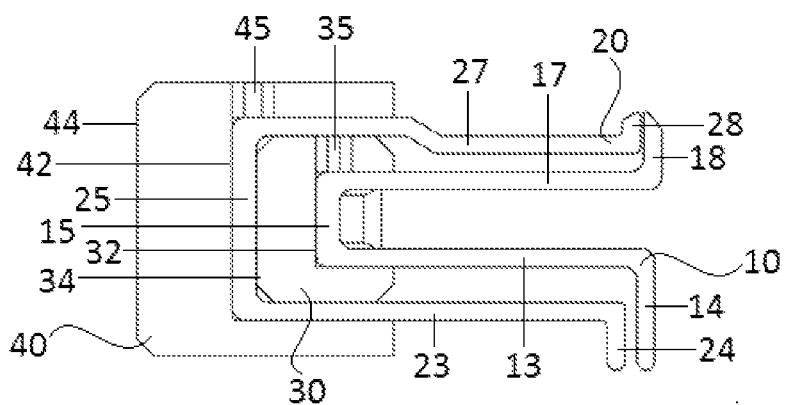
FIG. 3 shows a cross-sectional side view of an electrical contact assembly in an embodiment of this invention.

Referring to FIGS. 1 through 3, there are shown views of an electrical contact assembly in an embodiment of the present invention. This contact assembly comprises a plurality of inner pins (10) arranged in a row, an inner holder (30), a plurality of outer pins (20) arranged in a row, and an outer holder (40). Each said inner pin (10) is C-shaped with a vertical section (15) joining a horizontal bottom cantilever (13) to a horizontal top cantilever (17). At the other end of the bottom cantilever (13), a vertical load end (14) extends downwards, which during testing comes into contact with the load board of a testing apparatus. Similarly, at the other end of the top cantilever (17), a vertical device end (18) extends upwards, which during testing comes into contact with a device under test (DUT).

The said inner holder (30) is hollowed-out with a C-shaped cross-section and an open inner face, and is designed to wrap around the vertical section (15) side of the row of inner pins (10), in order to contain said inner pins (10). The said inner holder (30) is enclosed at each end to further contain said inner pins (10). The said inner holder (30) has an inner surface (32) on the inside of the C-shape which faces and, after assembly, is flush against the inner pin vertical section (15). The inner holder (30) also has an outer surface (34) which faces outwards and, after assembly, is flush against the outer pin vertical section (25). The inner holder (30) is provided with a series of elongated holes (35) on its top side which, after assembly, is adjacently above the top cantilevers (17) of the plurality of inner pins (10).

Each said outer pin (20) is C-shaped with a vertical section (25) joining a horizontal bottom cantilever (23) to a horizontal top cantilever (27). At the other end of the bottom cantilever (23), a vertical load end (24) extends downwards, which during testing comes into contact with the load board of a testing apparatus. Similarly, at the other end of the top cantilever (27), a vertical device end (28) extends upwards, which during testing comes into contact with a device under test (DUT). The outer pins (20) are designed to wrap around the inner holder (30). In each outer pin (20), the top cantilever (27) is raised slightly near its middle so that there are essentially two top horizontal sections joined by a diagonal section. This is to facilitate wrapping snugly around the inner holder (30).

The said outer holder (40) is hollowed-out with a C-shaped cross-section and an open inner face, and is designed to wrap around the vertical section (25) side of the row of outer pins (20), in order to contain said outer pins (20). The said outer holder (40) is partially enclosed at each end to further contain said outer pins (20).

The said outer holder (40) has an inner surface (42) on the inside of the C-shape which faces and, after assembly, is flush against the outer pin vertical section (25). The outer holder (40) also has an outer surface (44) which faces outwards. The outer holder (40) is provided with a series of elongated holes (45) on its top side which, after assembly, is adjacently above the top cantilevers (27) of the plurality of outer pins (20).

FIG. 4 shows an exploded perpendicular view of an assembly jig, base and clamp and step a. in an embodiment of this invention. Step a. comprises preparing an assembly jig by fastening a bottom guide template (60), a middle piece (70), and a top guide template (80), in that sequence, onto a top of a base (90). There is provided a pair of dowel pins (92) protruding upwards from said top of base (90). Corresponding holes located on each of the bottom guide template (60), middle piece (70), and top guide template (80) allow each of these layers to be guided down onto the base (90) via the said dowel pins (92) going through said holes. Once all 3 layers are stacked on top of the base (90), a pair of bolts (94) are tightened, thus securing the bottom guide template (60), middle piece (70), and top guide template (60) onto the base (90).

It can be seen from FIG. 4 that the bottom guide template (60) is provided with a bottom guide teeth section (65) comprising a row of elongated teeth running along a middle portion and an outer side of the bottom guide template (60). The middle piece (70) is provided with a horizontal lip (75) adapted for the C-shaped inner pins (10) to fit snugly over. The top guide template (80) is provided with a top guide teeth section (85) comprising a row of elongated teeth running along a middle portion and an outer side of the top guide template (80).

FIG. 4 also shows a clamp (50) which is designed to exert a restrictive horizontal force towards the base (90), so that any items assembled on the said assembly jig can be held securely in place.

FIG. 5 shows a cross-sectional side view of step b. in an embodiment of this invention. Step b. comprises inserting, one by one, a plurality of inner pins (10) into said assembly jig by driving each inner pin (10) inward and towards said horizontal lip (75) until each vertical section (15) comes up against a leading edge of said horizontal lip (75), and at the same time the inner pin load end (14) being guided between two of the elongated teeth in the bottom guide teeth section (65), and the inner pin device end (18) being guided between two of the elongated teeth in the top guide teeth section (85), thereby causing each inner pin (10) to align perpendicular to said middle piece (70) and fit snugly over said horizontal lip (75), and thereby said plurality of inner pins (10) forming a row. This figure also shows the stack of the assembly jig comprising the bottom guide template (60), middle piece (70) and top guide template (80).

FIG. 6 shows a cross-sectional side view of step c. in an embodiment of this invention. Step c. comprises driving a C-shaped inner holder (30) towards said row of inner pins (10), until an inner surface (32) of the inner holder (30) is stopped by and is flush against said inner pins vertical section (15), and the inner holder (30) wraps around and constrains a vertical section (15) side of said inner pins (10). The said series of elongated holes (35) along the top side of the inner holder (30) is then adjacently above said plurality of inner pins (10).

FIGS. 7 and 8 show the static state of the process right after step c. In FIG. 7, it can be seen that the inner holder (30) is snugly wrapped around the vertical section (15) side of the inner pins (10). The outlines of the elongated holes (35) can be seen to be adjacently above a portion of the inner pins (10). FIG. 8 shows that the inner pins (10) are all aligned perpendicularly to the inner holder (30). The series of elongated holes (35) are also shown in this figure.

FIG. 7 also shows the stack of the assembly jig comprising the bottom guide template (60), middle piece (70) and top guide template (80).

FIG. 9 shows a view of step d. in an embodiment of this invention. Step d. comprises applying adhesive such as epoxy into said series of elongated holes (35) so that said adhesive is dispensed across a portion of said plurality of inner pins (10). Once cured, this adhesive secures the said vertical section side of the inner pins (10) to the inner holder (30).

FIG. 10 shows a view of step e. in an embodiment of this invention. Step e. comprises inserting, one by one, a plurality of outer pins (20) onto said inner holder (30) by driving each outer pin (20) inward and towards an outer surface (34) of the inner holder (30) until each said vertical section (25) comes up against said outer surface (34), and at the same time the outer pin load end (24) being guided between two of the elongated teeth in the bottom guide teeth section (65), and the outer pin device end (28) being guided between two of the elongated teeth in the top guide teeth section (85), thereby causing each outer pin (20) to align perpendicular to said middle piece (70) and fit snugly over said inner holder (30), and thereby said plurality of outer pins (20) forming a row.

As each outer pin (20) is driven inward, the separation between the load end (24) and the device end (28) is at first not wide enough to pass the inner holder (30). As the load end (24) and the device end (28) meet the inner holder (30), the inner holder (30) moves them further apart as the outer pin (20) moves further inwards and against the inner holder (30). Once the said diagonal section of the said top cantilever of the outer pin (20) passes over the body of the inner holder (30), the outer pin (20) then reverts to its original shape, thus locking itself over the inner holder (30).

FIG. 11 shows a view of step f. in an embodiment of this invention. Step f. comprises driving a C-shaped outer holder (40) towards said row of outer pins (20), until an inner surface (42) of the outer holder (40) is stopped by and is flush against said outer pins vertical section (25), and the outer holder (40) wraps around and constrains a vertical section (25) side of the outer pins (20). The said series of elongated holes (45) along the top side of the outer holder (40) is then adjacently above said plurality of outer pins (20).

FIGS. 12 and 13 show the static state of the process right after step f. In FIG. 12, it can be seen that the outer holder (40) is snugly wrapped around the vertical section (25) side of the outer pins (20). The outlines of the elongated holes (45) can be seen to be adjacently above a portion of the outer pins (20). FIG. 13 shows that the outer pins (20) are all aligned perpendicularly to the outer holder (40). The series of elongated holes (45) are also shown in this figure.

FIG. 14 shows a view of step g. in an embodiment of this invention. Step g. comprises applying adhesive such as epoxy into said series of elongated holes (45) so that said adhesive is dispensed across a portion of said plurality of outer pins (20). Once cured, this adhesive secures the said vertical section side of the outer pins (20) to the outer holder (40) and the inner holder (30).

FIG. 15 shows a view of steps h. and i. in an embodiment of this invention. Step g. comprises securing the position of the said inner pins, inner holder, outer pins and outer holder relative to one another while applying heat to portions of said assembly for curing said adhesive. In a preferred embodiment, this step h. uses a clamp (50) that can be horizontally clamped to the base (90), and in so doing securing the position of the said inner pins, inner holder, outer pins and outer holder relative to one another.

In this way, the vertical sections (15, 25) of both inner pins (10) and outer pins (20) are secured to the inner holder (30) and the vertical section (25) of the outer pins (20) are secured to the outer holder (40). This securing of only the portions of the inner and outer pins close to the vertical sections (15, 25) while leaving the load board ends (14, 24) and device ends (18, 28) free cause the bottom cantilevers (13, 23) and top cantilevers (17, 27) to become cantilever springs.

Step i. comprises allowing said electrical contact assembly to cool down so that said adhesive is substantially hardened and thus inner pins, inner holder, outer pins and outer holder are secured together by the said hardened adhesive.

A final step (not shown in figures) involves removing said electrical contact assembly from said assembly jig.

While several particularly preferred embodiments of the present invention have been described and illustrated, it should now be apparent to those skilled in the art that various changes and modifications can be made without departing from the scope of the invention. Accordingly, the following claims are intended to embrace such changes, modifications, and areas of application that are within the scope of this invention.

The invention claimed is:

1. A process for manufacturing an electrical contact assembly for use in a testing apparatus, comprising the steps of:
   a. preparing an assembly jig comprising a bottom guide template, a middle piece, and a top guide template, said middle piece having a horizontal lip, and said bottom guide template and top guide template each having respectively a bottom guide teeth section and a top guide teeth section, said bottom guide teeth section and top guide teeth section each comprising a row of elongated teeth;
   b. inserting a plurality of inner pins into said assembly jig, each said inner pin having a C-shaped design formed by a bottom cantilever, a vertical section and a top cantilever, one by one, by driving said inner pin towards said horizontal lip until each said vertical section comes up against a leading edge of said horizontal lip, and at the same time said bottom cantilever being guided between two of said elongated teeth in said bottom guide teeth section, and said top cantilever being guided between two of said elongated teeth in said top guide teeth section, thereby causing each said inner pin to fit snugly over said horizontal lip, and thereby said plurality of inner pins forming a row;
   c. driving an inner holder towards said plurality of inner pins, such that said inner holder constrains a vertical section side of said inner pins, said inner holder provided with a plurality of elongated holes along its top side, said elongated holes adjacently above said plurality of inner pins;
   d. applying adhesive into said plurality of elongated holes so that said adhesive is dispensed across a portion of said plurality of inner pins;
   e. inserting a plurality of outer pins onto said inner holder, each said outer pin having a C-shaped design formed by a bottom cantilever, a vertical section and a top cantilever, one by one, by driving said outer pin towards an outer surface of said inner holder until each said vertical section comes up against said outer surface, and at the same time said bottom cantilever guided between two of said elongated teeth in said bottom guide teeth section, and said top cantilever guided between two of said elongated teeth in said top guide teeth section, thereby causing each outer pinto fit snugly over said inner holder, and said plurality of outer pins a row;
   f. an outer towards said plurality of outer pins, such that said outer holder constrains a vertical section side of said outer pins, said outer holder provided with a plurality of elongated holes along its top side, said elongated holes adjacently above said plurality of outer pins, and thus forming an electrical contact assembly comprising the inner pins, the inner holder, the outer pins and the outer holder;
   g. adhesive into said plurality of elongated so that said adhesive is dispensed across said plurality of outer pins; and
   h. securing the position of the inner pins, the inner holder, the outer and the outer holder relative to one another while applying heat to portions of said for curing said adhesive.

2. A process for manufacturing an electrical contact for use in a testing apparatus according to claim 1, wherein said step a. preparing an assembly jig comprises fastening said bottom guide template, said middle piece, and said top guide template, in that sequence, onto a top of a base.

3. A process for manufacturing an electrical contact assembly for use in a testing apparatus according to claim 1, wherein said step h. securing the position of the inner pins, the inner holder, the outer pins and the outer holder relative to one another comprises using a clamp that is driven towards said assembly jig so that it holds said electrical contact assembly in position in between said clamp and said assembly jig.

4. A process for manufacturing an electrical contact assembly for use in a testing apparatus according to claim 1, further comprising the steps:
   i. allowing said electrical contact assembly to cool down so that said adhesive is substantially hardened and thus the inner pins, the inner holder, the outer and the outer holder are secured together; and
   j. removing said electrical contact assembly from said assembly jig.

5. A process for manufacturing an electrical contact assembly for use in a testing apparatus according to claim 1, wherein the said adhesive is an epoxy.

6. A process for manufacturing an electrical contact assembly for use in a testing apparatus according to claim 1, wherein said inner holder and said outer holder are made from engineering plastic.

\* \* \* \* \*